United States Patent
Wang et al.

(10) Patent No.: US 11,556,036 B2
(45) Date of Patent: Jan. 17, 2023

(54) METAL STRUCTURE AND METHOD FOR FABRICATING SAME AND DISPLAY PANEL USING SAME

(71) Applicant: AU OPTRONICS CORPORATION, Hsin-Chu (TW)

(72) Inventors: Shuo-Hong Wang, Hsin-Chu (TW); Chun-Nan Lin, Hsin-Chu (TW); Chia-Tsung Wu, Hsin-Chu (TW); Chi-Ting Kuo, Hsin-Chu (TW); Ko-Jui Lee, Hsin-Chu (TW); Chia-Hung Li, Hsin-Chu (TW); Chia-Ming Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 194 days.

(21) Appl. No.: 17/080,313

(22) Filed: Oct. 26, 2020

(65) Prior Publication Data

US 2021/0041751 A1 Feb. 11, 2021

Related U.S. Application Data

(62) Division of application No. 16/205,938, filed on Nov. 30, 2018, now Pat. No. 10,852,605.

(51) Int. Cl.
*H01L 27/12* (2006.01)
*H01L 29/423* (2006.01)
(Continued)

(52) U.S. Cl.
CPC ...... *G02F 1/136286* (2013.01); *G02F 1/1368* (2013.01); *H01L 21/28568* (2013.01); *H01L 27/124* (2013.01); *H01L 27/1262* (2013.01); *H01L 29/42384* (2013.01); *H01L 29/4908* (2013.01); *G02F 1/136295* (2021.01);
(Continued)

(58) Field of Classification Search
CPC ......... H01L 23/53266; H01L 21/28568; H01L 23/53238; H01L 23/53252; H01L 27/124; H01L 29/4908; H01L 23/53223; H01L 27/1262; H01L 21/32139; H01L 29/42384; H01L 21/32134; H01L 29/45; H01L 21/31133; G02F 1/1368; G02F 1/136286; G02F 1/136295
See application file for complete search history.

(56) References Cited

FOREIGN PATENT DOCUMENTS

| JP | 201186921 A | 4/2011 |
|---|---|---|
| JP | 2016533562 A | 10/2016 |
| WO | 2015048828 A1 | 9/2015 |

OTHER PUBLICATIONS

Office Action issued by Japan Intellectual Property dated Mar. 10, 2021 for Application No. 2020-532745, Japan.

*Primary Examiner* — Savitri Mulpuri
(74) *Attorney, Agent, or Firm* — Tim Tingkang Xia, Esq.; Locke Lord, LLP

(57) ABSTRACT

A metal structure includes a patterned molybdenum tantalum oxide layer and a patterned metal layer. The patterned molybdenum tantalum oxide layer is disposed on a first substrate, in which the patterned molybdenum tantalum oxide layer includes about 2 to 12 atomic percent of tantalum. Both of an atomic percent of molybdenum and an atomic percent of oxygen of the patterned molybdenum tantalum oxide layer are greater than the atomic percent of tantalum of the patterned molybdenum tantalum oxide layer. The patterned metal layer is disposed on the patterned molybdenum tantalum oxide layer.

7 Claims, 15 Drawing Sheets

(51) Int. Cl.
 *H01L 21/285* (2006.01)
 *G02F 1/1362* (2006.01)
 *G02F 1/1368* (2006.01)
 *H01L 29/49* (2006.01)
 *H01L 29/45* (2006.01)
 *H01L 21/3213* (2006.01)
 *H01L 21/311* (2006.01)
(52) U.S. Cl.
 CPC ... *H01L 21/31133* (2013.01); *H01L 21/32134* (2013.01); *H01L 29/45* (2013.01)

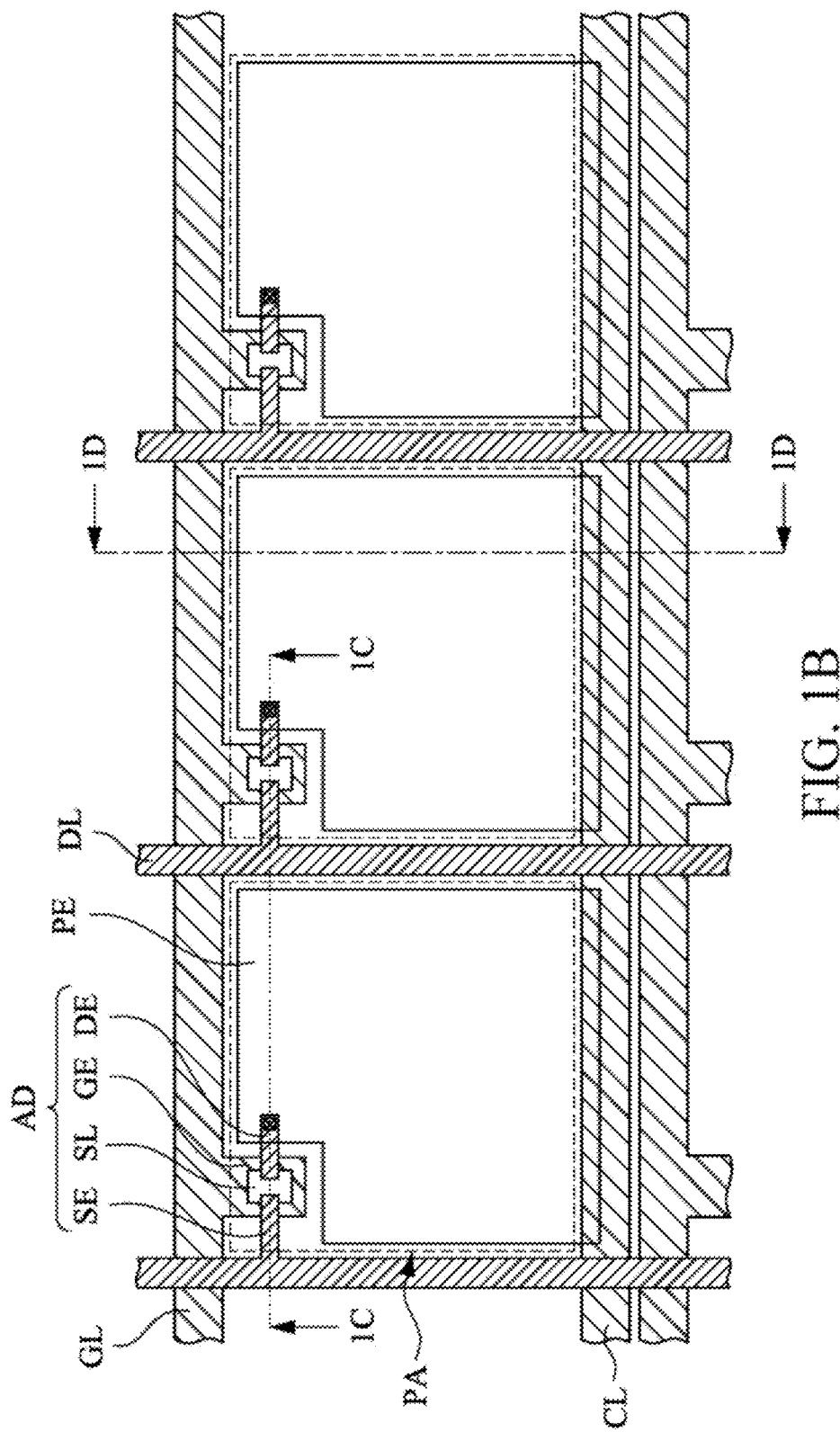

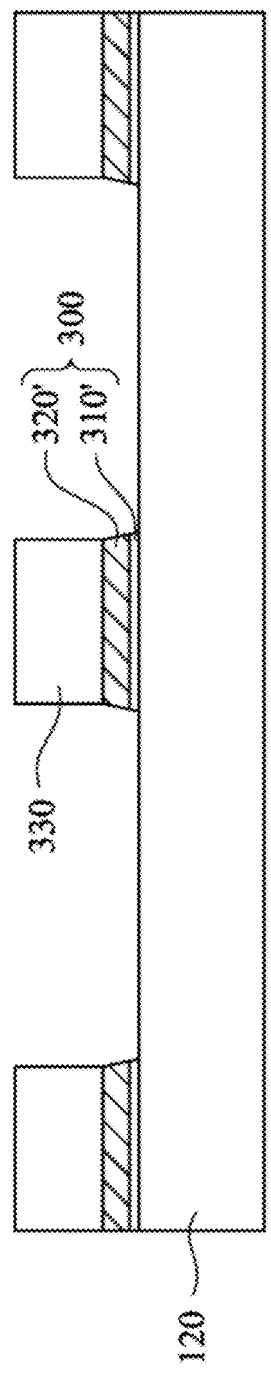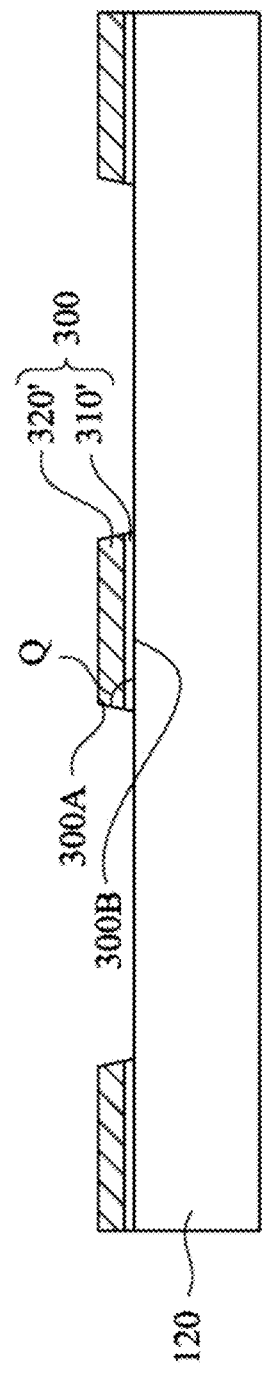

METAL STRUCTURE AND METHOD FOR FABRICATING SAME AND DISPLAY PANEL USING SAME

CROSS-REFERENCE TO RELATED PATENT APPLICATION

This application is a divisional application of U.S. patent application Ser. No. 16/205,938, filed on Nov. 30, 2018, now pending, which itself claims priority to and the benefit of, pursuant to 35 U.S.C. § 119(a), patent application Serial No. 201711373560.1 filed in China on Dec. 19, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a metal structure and a method for fabricating same and a display panel using same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Characterized by light and thin appearances, little power consumption, a wide application range, and the like, liquid crystal display panels already become mainstream products of current displays. On one hand, to achieve a wider visual effect, a narrow bezel gradually becomes a development objective of a liquid crystal display panel. On the other hand, because conducting wires in the liquid crystal display panel reflect light from the outside, which affects the visual effect, a black matrix layer is often disposed in the liquid crystal display panel currently. This prevents the conducting wires from reflecting the light from the outside, but also causes problems such as a lower aperture ratio and a reduced display luminance.

Therefore, a current objective is to develop a display panel that has a narrow bezel or is four side bezel-less and can effectively reduce the light reflection without reducing the display luminance.

SUMMARY

In multiple implementations of the present disclosure, an active device array substrate can be made to be near a user by disposing a patterned molybdenum tantalum oxide layer and a patterned metal layer (that is, the active device array substrate provides a display surface). According to some implementations of the present disclosure, a metal structure includes the patterned molybdenum tantalum oxide layer and the patterned metal layer. The patterned molybdenum tantalum oxide layer is disposed on a first substrate, but the present disclosure is not limited thereto. The patterned molybdenum tantalum oxide layer includes about 2 to 12 atomic percent of tantalum, and both of an atomic percent of molybdenum and an atomic percent of oxygen are greater than the atomic percent of tantalum. The patterned metal layer is disposed on the patterned molybdenum tantalum oxide layer.

In some implementations of the present disclosure, the patterned molybdenum tantalum oxide layer includes about 5 to 60 atomic percent of oxygen.

In some implementations of the present disclosure, the thickness of the patterned molybdenum tantalum oxide layer is between about 50 Å and about 600 Å.

In some implementations of the present disclosure, the thickness of the patterned metal layer is between about 50 Å and about 10000 Å.

In some implementations of the present disclosure, the reflectivity of the patterned molybdenum tantalum oxide layer within a visible light range is between about 2% and about 20%.

In some implementations of the present disclosure, an angle between a side surface and a bottom surface of the metal structure is between about 10 degrees and 80 degrees.

According to some implementations of the present disclosure, a display panel includes a first substrate, a second substrate, a display medium layer, a patterned molybdenum tantalum oxide layer, and a patterned metal layer. The first substrate has an outer surface, an inner surface, and a first side edge connecting the outer surface and the inner surface, and the outer surface serves as a display surface of the display panel. The second substrate has an outer surface, an inner surface, and a second side edge connecting the outer surface and the inner surface. The inner surface of the second substrate is opposite to the inner surface of the first substrate, the first side edge and the second side edge are located on a same side of the display panel, and the first side edge is substantially aligned with or longer than the second side edge. The display medium layer is disposed between the first substrate and the second substrate. The patterned molybdenum tantalum oxide layer is disposed on the inner surface of the first substrate. The patterned metal layer is disposed between the patterned molybdenum tantalum oxide layer and the inner surface of the second substrate.

In some implementations of the present disclosure, the display panel includes a backlight module configured to provide a light for the second substrate. The second substrate is located between the first substrate and the backlight module, and the light sequentially penetrates through the second substrate, the display medium layer, and the first substrate.

In some implementations of the present disclosure, the patterned metal layer includes at least one of a gate line, a gate, a common line, a data line, a source, or a drain.

In some implementations of the present disclosure, the patterned molybdenum tantalum oxide layer includes about 2 to 12 atomic percent of tantalum, and both of an atomic percent of molybdenum and an atomic percent of oxygen are greater than the atomic percent of tantalum.

In some implementations of the present disclosure, the patterned molybdenum tantalum oxide layer includes about 5 to 60 atomic percent of oxygen.

In some implementations of the present disclosure, the thickness of the patterned molybdenum tantalum oxide layer is between about 50 Å and about 600 Å.

According to some implementations of the present disclosure, a method for fabricating a metal structure includes:

providing a first substrate; forming a molybdenum tantalum oxide layer on an inner surface of the first substrate, where the molybdenum tantalum oxide layer includes a molybdenum tantalum oxide including about 2 to 12 atomic percent of tantalum, and both of an atomic percent of molybdenum and an atomic percent of oxygen are greater than the atomic percent of tantalum; forming a metal layer on the molybdenum tantalum oxide layer; and performing a patterning process on the molybdenum tantalum oxide layer and the metal layer to form a patterned molybdenum tantalum oxide layer and a patterned metal layer.

In some implementations of the present disclosure, the step of performing a patterning process on the molybdenum tantalum oxide layer and the metal layer includes: forming a patterned photoresist layer on the metal layer; and etching, by using an acid etching solution, the molybdenum tantalum oxide layer and the metal layer by using the patterned photoresist layer as a mask.

In some implementations of the present disclosure, the step of performing a patterning process on the molybdenum tantalum oxide layer and the metal layer includes removing the patterned photoresist layer by using an alkaline photoresist removal solution.

In some implementations of the present disclosure, the molybdenum tantalum oxide includes about 5 to 60 atomic percent of oxygen.

In some implementations of the present disclosure, the step of forming a molybdenum tantalum oxide layer on the first substrate includes performing a non-reactive sputtering process.

In some implementations of the present disclosure, the thickness of the patterned molybdenum tantalum oxide layer is between about 50 Å and about 600 Å.

In some implementations of the present disclosure, the reflectivity of the patterned molybdenum tantalum oxide layer within a visible light range is between about 2% and about 20%.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 1B is a top view of a display panel according to an embodiment of the present disclosure;

FIG. 2A to FIG. 2E are schematic sectional views of a metal structure in multiple stages of a method for fabricating the metal structure according to some implementations of the present disclosure;

DETAILED DESCRIPTION

Figure 1A:
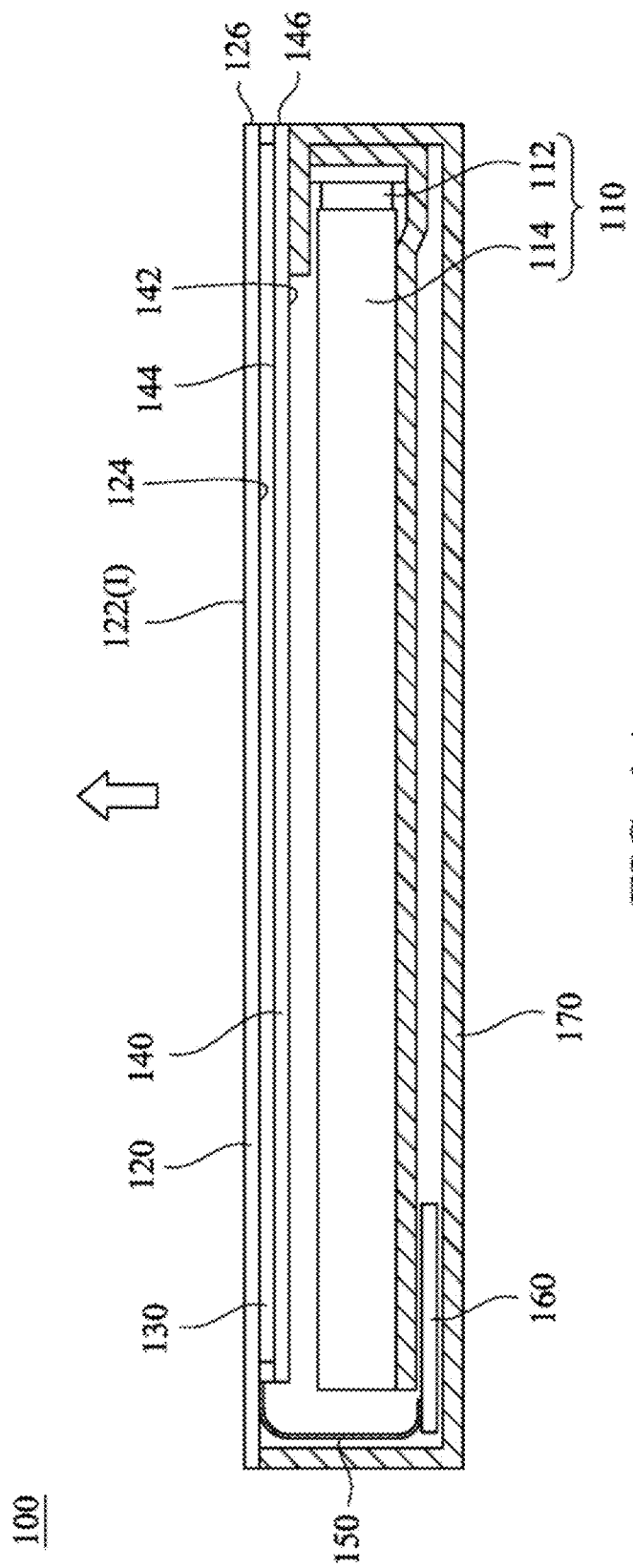
FIG. 1A is a schematic sectional view of a display panel according to some implementations of the present disclosure.

Multiple implementations of the present disclosure are disclosed with reference to the drawings below, and for clear description, many practical details are described in the following descriptions. However, it should be understood that, the practical details should not be intended to limit the present disclosure. That is, in some implementations of the present disclosure, the practical details are not necessary. In addition, for simplification of the drawings, some conventional and habitual structures and elements are shown in the drawings in a simple and schematic manner.

In the accompanying drawings, for clarity, thicknesses of a layer, a film, a panel, an area, and the like are enlarged. In the entire specification, same reference numerals indicate same elements. It should be understood that when an element such as a layer, a film, an area, or a substrate is referred to as being "on" another element or being "connected" to another element, the element may be directly on the another element or connected to the another element, or an intermediate element may exist. On the contrary, when an element is referred to as being "directly on another element" or "directly connected to" another element, no intermediate element exists. As used in this specification, "connection" may be physical and/or electrical connection (or referred to as coupling). However, electrical connection (or referred to as coupling) means that another element exists between two elements.

It should be understood that, although the terms "first", "second", and the like as used in this specification are used for describing various elements, components, areas, layers, and/or parts, the elements, components, areas, layers, and/or parts should not be limited to these terms. These terms are merely used for distinguishing one element, component, area, layer, or part from another element, component, area, layer, or part. Therefore, "first element", "component", "area", "layer", or "part" described below may be referred to as a second element, component, area, layer, or part without departing from the teachings in this specification.

The terms used herein are merely intended to describe objectives of particular embodiments and are not restrictive. As used in this specification, the singular forms "a", "an", and "the" are intended to include plural forms, including "at least one", unless the content clearly indicates otherwise. "Or" means "and/or". As used in this specification, the term "and/or" includes any and all combinations of one or more related and listed items. It should further be understood that, when used in this specification, the terms "include" and/or "comprise" specify the existence of the features, areas, integers, steps, operations, elements, and/or components, but do not exclude the existence or addition of one or more other features, areas, integers, steps, operations, elements, components, and/or combinations thereof.

In addition, relative terms such as "lower" or "bottom" and "upper" or "top" may be used in this specification to describe a relationship between one element and another element, as is shown in drawings. It should be understood that relative terms are intended to include different orientations of the device other than the orientations shown in the drawings. For example, if a device in one accompanying drawing is turned over, elements described as "under" the other elements are oriented "on" the other elements. Therefore, the exemplary term "lower" may include orientations of "lower" and "upper", depending on a particular orientation of the accompanying drawings. Similarly, if a device in one accompanying drawing is turned over, elements described as "below" or "beneath" the other elements are oriented "above" the other elements. Therefore, the exemplary terms "lower" or "below" may include orientations of above and below.

In consideration of a discussed measurement and a particular quantity of errors related to the measurement (that is, a limitation of a measurement system), "about" or "substantially" used in this specification includes the value and an average value in an acceptable deviation range of a particular value determined by a person of ordinary skill in the art. For example, "about" may indicate to be within one or more standard deviations of the value, or within ±30%, ±20%, ±10%, or ±5%. Further, for "about" or "substantially" used in this specification, a relatively acceptable deviation range or standard deviation may be selected according to the optical property, the etching property, or another property, and one standard deviation may not be used for all properties.

Unless otherwise defined, all terms (including technical and scientific terms) used in this specification have the same meaning as that understood by a person of ordinary skill in the art. It should be further understood that terms defined in a usually used dictionary should be explained to have a consistent meaning with that in the related art and the context of this specification, and not be explained to have an ideal or excessively formal meaning, unless clearly defined in this specification.

FIG. 1A is a schematic sectional view of a display panel 100 according to some implementations of the present disclosure. The display panel 100 includes a first substrate 120, a display medium layer 130, and a second substrate 140. The display medium layer 130 is disposed between the first substrate 120 and the second substrate 140. The display medium layer 130 may be a self-luminescent material (such as an organic light-emitting layer or a micro light-emitting diode) or a non-self-luminescent material (such as a liquid crystal layer or an electrophoretic layer). In this embodiment, the display medium layer 130 uses the non-self-luminescent material (such as the liquid crystal layer) as an example, the display panel 100 may optionally further include a backlight module 110 configured to provide a light for the second substrate 140. The second substrate 140 is located between the first substrate 120 and the backlight module 110, and the light sequentially penetrates through the second substrate 140, the display medium layer 130, and the first substrate 120. In this implementation, the backlight module 110 may use an edge-type design, and the backlight module 110 may include a light source 112, a light guide plate 114, or another appropriate element. The light source 112 may include an inorganic light-emitting source, an organic light-emitting source, or another appropriate material, or a combination of the foregoing. In some implementations, the backlight module 110 may use a direct-type design, and the backlight module 110 may include the light source 112 or another appropriate element. In other implementations, when the display medium layer 130 is the self-luminescent material, configuration of the backlight module 110 may be omitted.

The first substrate 120 has an outer surface 122, an inner surface 124, and a first side edge 126 connecting the outer surface 122 and the inner surface 124, and the outer surface 122 serves as a display surface I of the display panel 100. In some implementations of the present disclosure, a metal structure is disposed on the inner surface 124 of the first substrate 120 to control the display medium layer 130. For example, the first substrate 120 may be an active device array substrate such as a thin film transistor substrate.

The second substrate 140 has an outer surface 142, an inner surface 144, and a second side edge 146 connecting the outer surface 142 and the inner surface 144, and the inner surface 144 of the second substrate 140 faces the inner surface 124 of the first substrate 120. In an embodiment, both the first side edge 126 and the second side edge 146 are located on a same side of the display panel 100, and the first side edge 126 is substantially aligned with or longer than the second side edge 146. For example, the second substrate 140 may be a color filter substrate or an ordinary substrate.

The display panel 100 may further include a flexible circuit board 150, a circuit board 160, and a housing 170. The flexible circuit board 150 is in contact with the first substrate 120 to connect circuits on the first substrate 120 and the second substrate 140 to the circuit board 160. The housing 170 is configured to load various elements of the display panel 100. Herein, a frame (not marked) for sheltering circuit configurations such as the flexible circuit board 150 does not need to be additionally disposed if the first substrate 120 (such as the active device array substrate) is disposed near a user (for example, the first substrate 120 provides the display surface I (for example, at a blank arrow in FIG. 1A)), so as to achieve a narrow bezel effect.

Figure 1C:
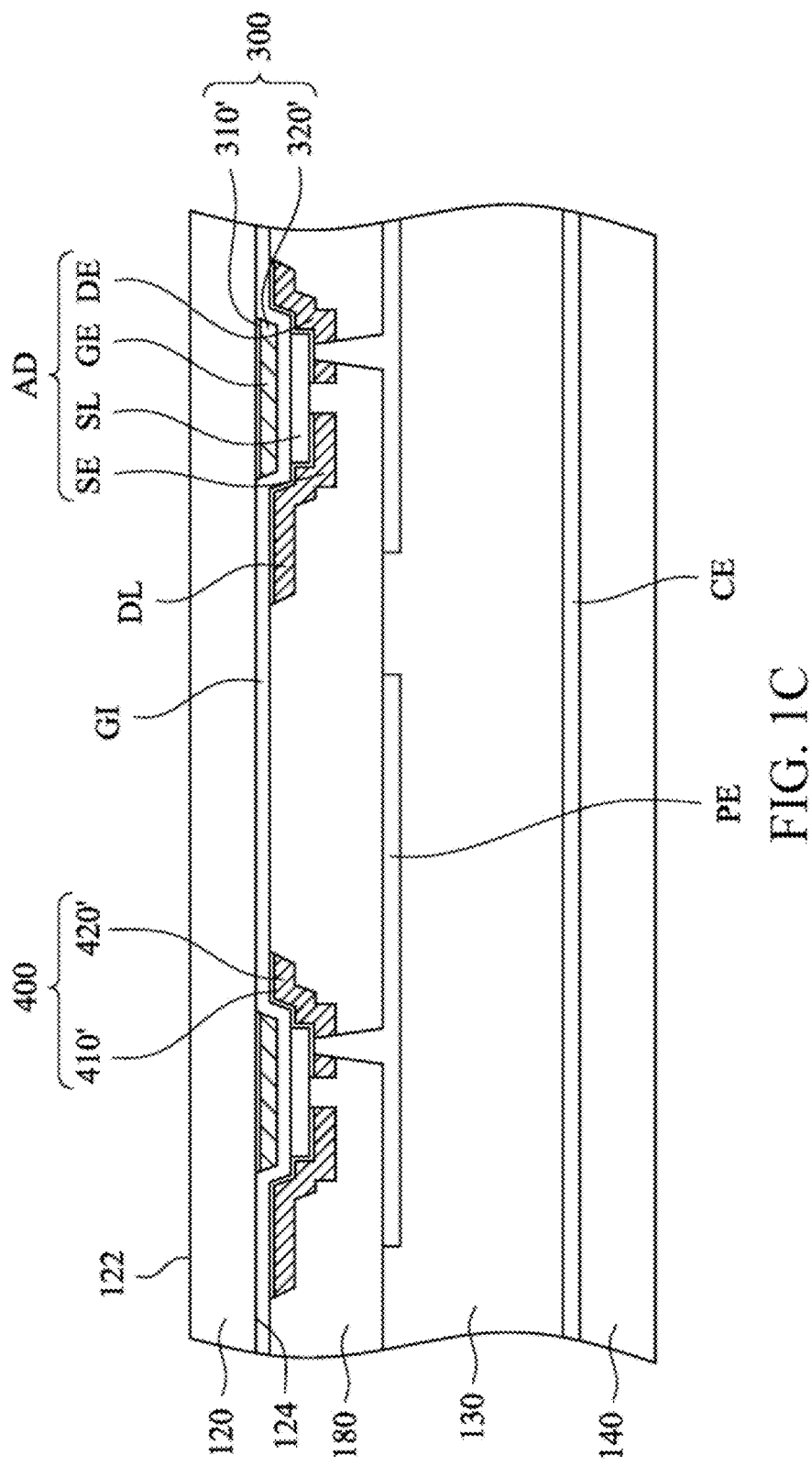
FIG. 1C is a schematic sectional view drawn along a section line 1B-1B in FIG. 1B.
Figure 1D:
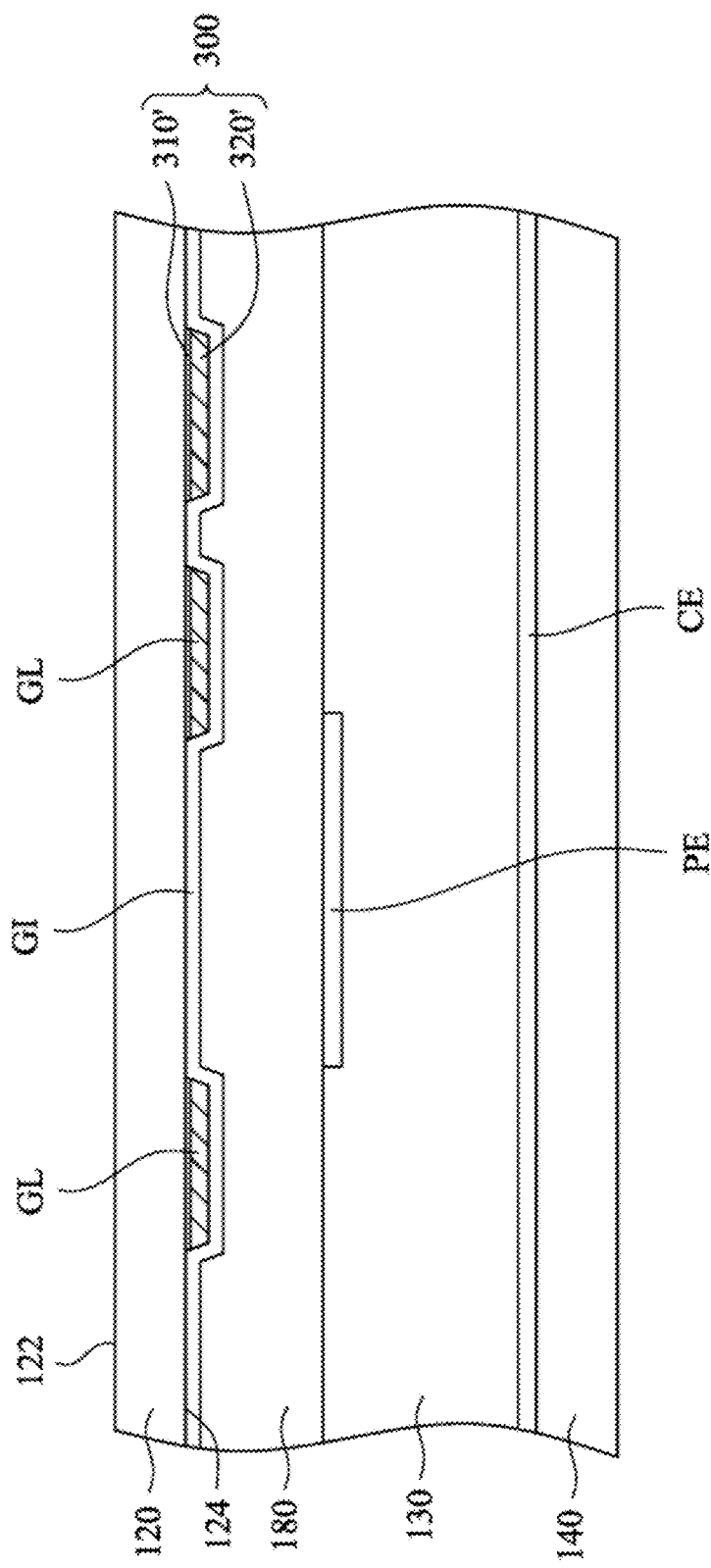
FIG. 1D is a schematic sectional view drawn along a section line 1C-1C in FIG. 1B.

FIG. 1B is a partial top view of a display panel 100 according to an embodiment of the present disclosure. FIG. 1C is a schematic sectional view drawn along a section line 1B-1B in FIG. 1B. FIG. 1D is a schematic sectional view drawn along a section line 1C-1C in FIG. 1B. Refer to FIG. 1A to FIG. 1D.

The display panel 100 may include a data line DL, a gate line GL, a gate insulator layer GI, an active device AD, and a pixel electrode PE, which are disposed the inner surface 124 of the first substrate 120. In some embodiments, display panel 100 may optionally further include a common line CL or another appropriate line. The data line DL and the gate line GL are alternately disposed to define a plurality of pixel areas PA, but are not limited thereto. In some embodiments, a pixel area PA includes at least one active device AD and at least one pixel electrode PE, and the pixel electrode PE is electrically connected to the active device AD. In some embodiments, a pixel area PA may include at least one data line DL and at least one gate line GL or another appropriate line.

The active device AD includes a semiconductor layer SL, a gate electrode GE, a source electrode SE, and a drain electrode DE. The source electrode SE and the drain electrode DE are electrically connected to two ends of the semiconductor layer SL respectively, and the gate electrode GE is configured to control on and off of the two ends of the semiconductor layer SL. The gate electrode GE is separated from the semiconductor layer SL by using the gate insulator layer GI. In some implementations, the gate electrode GE is electrically connected to the gate line GL, the source electrode SE is electrically connected to the data line DL, and the drain electrode DE is electrically connected to the pixel electrode PE. In this way, the active device AD may switch on the data line DL and the pixel electrode PE by controlling the gate line GL. In this implementation, the active device AD is preferably a bottom-gate thin film transistor (Bottom-Gate TFT), for example, the gate electrode GE is located between the semiconductor layer SL and the inner surface 124 of the first substrate 120. In other implementations, the active device AD may alternatively be a top-gate thin film transistor (Top-Gate TFT), for example, the semiconductor layer SL is located between the gate electrode GE and the inner surface 124 of the first substrate 120.

In addition, a protection layer 180 is disposed between the pixel electrode PE and the active device AD. Herein, the gate insulator layer GI and the protection layer 180 use an insulation material, including an inorganic material (for example, silicon oxide, silicon nitride, silicon oxynitride, or another appropriate material), an organic material (for example, a colorless or colored photoresist, polyimide, benzocyclobutene, or another appropriate material), or another appropriate material.

Herein, because the first substrate 120 (such as the active device array substrate) is made to be near the user (for example, the active device array substrate provides the display surface I (for example, at the blank arrow in FIG. 1A)), materials of a metal and/or alloy layer on the first substrate 120 easily reflect the light, and consequently, a visual effect is affected. In multiple implementations of the present disclosure, the reflectivity may be reduced by disposing a low-reflection layer (for example, the metal or alloy layer). In a preferred embodiment, a black matrix may not need to be additionally disposed on the first substrate 120, therefore, the aperture ratio of the display panel 100 is increased, but the present disclosure is not limited thereto and a person skilled in the art can make a selection based on actual requirements.

In detail, referring to FIG. 1C and FIG. 1D, in some implementations of the present disclosure, the gate line GL on the inner surface 124 of the first substrate 120, a common line CL that can be optionally disposed, the gate electrode GE of the active device AD, or another appropriate line, or any one of the foregoing lines may be formed by a patterned metal layer 320'. A patterned molybdenum tantalum oxide layer 310' is further disposed between the patterned metal layer 320' and the inner surface 124 of the first substrate 120. For example, the patterned molybdenum tantalum oxide layer 310' is disposed between the inner surface 124 of the first substrate 120 and the patterned metal layer 320', and the patterned molybdenum tantalum oxide layer 310' and the patterned metal layer 320' together are referred to as a metal structure 300. The patterned metal layer 320' may be of a monolayer or multilayer structure, and a material of the patterned metal layer 320' may include metal, alloy, or a salt thereof, or another material having the reflectivity. The patterned molybdenum tantalum oxide layer 310' may also be a monolayer or multilayer structure.

In some implementations of the present disclosure, the data line DL on the inner surface 124 of the first substrate 120, the source electrode SE and the drain electrode DE of the active device AD, or another appropriate line, or any one of the foregoing lines may be formed by a patterned metal layer 420'. If the bottom-gate TFT is used as an example, a patterned molybdenum tantalum oxide layer 410' is further disposed between the patterned metal layer 420' and the gate insulator layer GI. For example, the patterned molybdenum tantalum oxide layer 410' is disposed on the gate insulator layer GI, and the patterned metal layer 420' is disposed on the patterned molybdenum tantalum oxide layer 410'. If the top-gate TFT is used as an example, a patterned molybdenum tantalum oxide layer 410' is further disposed between the patterned metal layer 420' and the inner surface 124 of the first substrate 120. For example, the patterned metal layer 420' is disposed on the patterned molybdenum tantalum oxide layer 410'. The patterned molybdenum tantalum oxide layer 410' and the patterned metal layer 420' together are referred to as a metal structure 400. The patterned metal layer 420' may be of a monolayer or multilayer structure, and a material of the patterned metal layer 320' may include metal, alloy, or a salt thereof, or another material having the reflectivity. The patterned molybdenum tantalum oxide layer 410' may also be of a monolayer or multilayer structure.

In this way, the patterned molybdenum tantalum oxide layers 310' and 410' may prevent the light entering the display panel 100 from the outer surface 122 of the first substrate 120 from being reflected by the patterned metal layers 320' and 420', affecting the visual effect of a viewer.

Herein, the thicknesses of the patterned molybdenum tantalum oxide layers 310' and 410' may be between about 50 Å and about 600 Å, and the thicknesses of the patterned metal layers 320' and 420' may be between about 50 Å and about 10000 Å, but are not limited thereto.

In some implementations of the present disclosure, the patterned molybdenum tantalum oxide layers 310 and 410 include about 2 to 12 atomic percent of tantalum, and both of an atomic percent of molybdenum and an atomic percent of oxygen are greater than the atomic percent of tantalum. The content setting may reduce or eliminate an over-etching problem of the patterned molybdenum tantalum oxide layer during a patterning process. In some implementations, the patterned molybdenum tantalum oxide layers 310' and 410' include about 5 to about 60 atomic percent of oxygen. If no other elements or impurities exist in a molybdenum tantalum oxide, a sum of the atomic percent of molybdenum, the atomic percent of tantalum, and the atomic percent of oxygen is about equal to 100%, without a unit; if other elements or impurities exist in the molybdenum tantalum oxide, a sum of atomic percents of other elements or impurities and the sum of the atomic percents of the foregoing is about equal to 100%, without a unit.

In this embodiment, a common electrode CE may optionally be further included and is disposed on the second substrate 140, but the present disclosure is not limited thereto. The common electrode CE may optionally be disposed on the first substrate 120 or the second substrate 140. Configuration of an upper electrode and a lower electrode is used as an example herein, but the present disclosure is not limited thereto. In some implementations, the foregoing metal structures 300 and 400 may be disposed in an in-plane-switching (IPS) liquid crystal display panel. Alternatively, in other implementations, the foregoing metal structures 300 and 400 may be disposed in a multi-domain vertical alignment (MVA) liquid crystal display panel.

FIG. 2A to FIG. 2E are schematic sectional views of a metal structure 300 in multiple stages of a method for fabricating the metal structure 300 according to some implementations of the present disclosure. The method for fabricating the metal structure 300 is described in detail below.

Figure 2A:
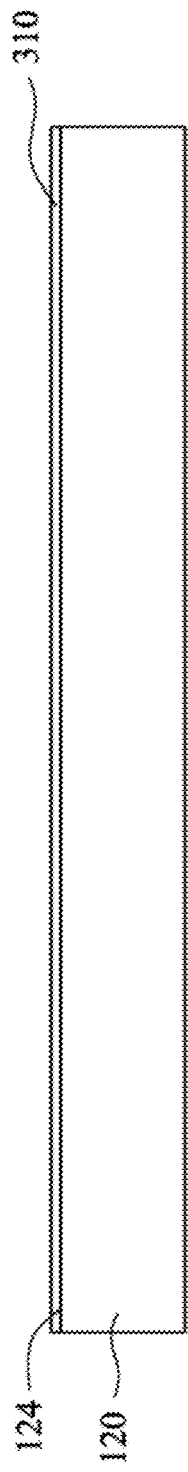

Referring to FIG. 2A, a first substrate 120 is provided, and a molybdenum tantalum oxide layer 310 is formed on the inner surface 124 of the first substrate 120. The thickness of the molybdenum tantalum oxide layer 310 may be between about 50 Å and about 600 Å, and the molybdenum tantalum oxide layer 310 includes a molybdenum tantalum oxide. In some implementations of the present disclosure, the step of forming a molybdenum tantalum oxide layer 310 on the first substrate 120 includes performing a non-reactive sputtering process or a reactive sputtering process. In an embodiment, the non-reactive sputtering process is used as an example, and a physical vapor deposition (PVD) may be used. In this embodiment, PVD is performed when no reactant gas (for example, oxygen, nitrogen, or another appropriate gas, or a mixture of the foregoing gases) is inlet, and the film formation uniformity of the molybdenum tantalum oxide layer 310 may be improved.

Figure 2B:
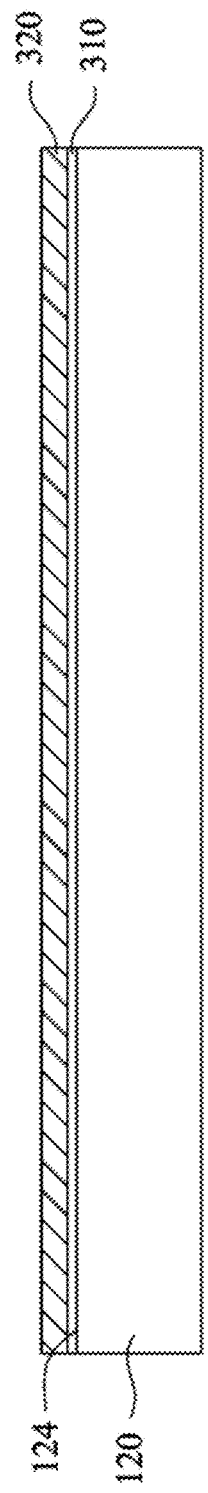

Referring to FIG. 2B, a metal layer 320 is formed on the molybdenum tantalum oxide layer 310. The thickness of the metal layer 320 may be between about 50 Å and about 10000 Å. A material of the metal layer 320 may be at least one of aluminum, copper, silver, titanium, molybdenum, tantalum, niobium, magnesium, zinc, or neodymium, a metal composite layer of the foregoing materials, an alloy of the foregoing materials, a salt of the foregoing materials, or another appropriate metal conductive material. In this embodiment, the metal layer 320 is a monolayer metal layer, but the present disclosure is not limited thereto. The metal layer 320 may alternatively be of a laminated structure of a metal material or of a laminated structure of another material and the metal material.

Figure 2C:
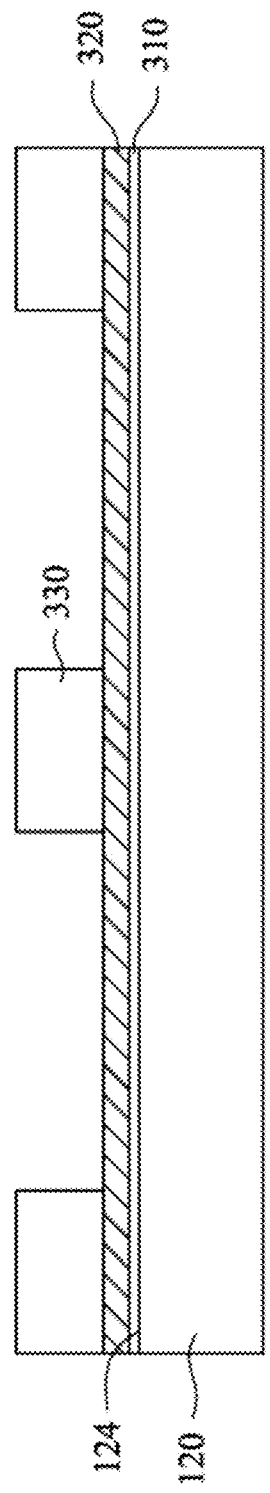

Referring to FIG. 2C to FIG. 2E, a patterning process is performed on the molybdenum tantalum oxide layer 310 and the metal layer 320 to form a patterned molybdenum tantalum oxide layer 310' and a patterned metal layer 320', together referred to as the metal structure 300.

First, referring to FIG. 2C, a patterned photoresist 330 is formed on the metal layer 320. The patterned photoresist 330 may be formed by dispensing a photoresist layer, partially exposing the photoresist layer, and removing the exposed/unexposed photoresist layer. The patterned photoresist 330 may be a positive photoresist or a negative photoresist, and the present disclosure is not limited thereto.

Subsequently, referring to FIG. 2D, the patterned photoresist 330 is used as a mask to etch the metal layer 320 and the molybdenum tantalum oxide layer 310 so as to form a patterned metal layer 320' and a patterned molybdenum tantalum oxide layer 310', the patterned metal layer 320' and the patterned molybdenum tantalum oxide layer 310 being collectively referred to as the metal structure 300. As described above, the patterned metal layer 320' may include the gate line GL, the common line CL that can be optionally disposed, the gate electrode GE of the active device AD (referring to FIG. 1B to FIG. 1D), or any one of other appropriate lines. In some implementations, the etching is performed by using an acid etching solution such as hydrogen peroxide solution, sulfuric acid, or a combination thereof, but the present disclosure is not limited thereto. Appropriate ingredients of the etching solution are selected according to ingredients of the metal structure 300.

Further, referring to FIG. 2E, the patterned photoresist 330 is removed to facilitate disposing of other layers on the patterned metal layer 320'. In some implementation, an alkaline photoresist removal solution is preferably used to perform the removal of the patterned photoresist 330. After experiencing the acid etching solution and the alkaline photoresist removal solution, a side of the metal structure 300 near the first substrate 120 (for example, the patterned molybdenum tantalum oxide layer 310' of the metal structure 300) may have an undercut problem. The undercut problem may be improved by adjusting an atomic percent of tantalum in the patterned molybdenum tantalum oxide layer 310', and refer to FIG. 3A to FIG. 3D and FIG. 4A to FIG. 4D. In some implementations, ideally, an angle Q exists between a side surface 300A and a bottom surface 300B of the metal structure 300, and the angle Q is between about 10 degrees and 80 degrees.

Although merely the method for fabricating the metal structure 300 (referring to FIG. 1B and FIG. 2E) is mentioned herein, it should be learned that, the metal structure 400 (referring to FIG. 1B) may also be formed by using the same fabricating method (referring to FIG. 3A to FIG. 3D). The patterned metal layer 420' (referring to FIG. 1B) may be any one of the data line DL and the source electrode SE or the drain electrode DE of the active device AD or another appropriate line. A material of the patterned metal layer 420' may substantially be the same with or different from that of the patterned metal layer 320'. For example, the material of the patterned metal layer 420' (referring to FIG. 1B) may be at least one of aluminum, copper, silver, titanium, molybdenum, tantalum, niobium, magnesium, zinc, or neodymium, a metal composite layer of the foregoing materials, an alloy of the foregoing materials, a salt of the foregoing materials, or another appropriate metal conductive material. Atomic percents of the materials used by the patterned molybdenum tantalum oxide layers 310' and 410' may substantially be the same or different. Other details of the metal structure 400 (referring to FIG. 1B) are approximately similar to the method for fabricating the metal structure 300, and no further details are provided herein.

Figure 3A:
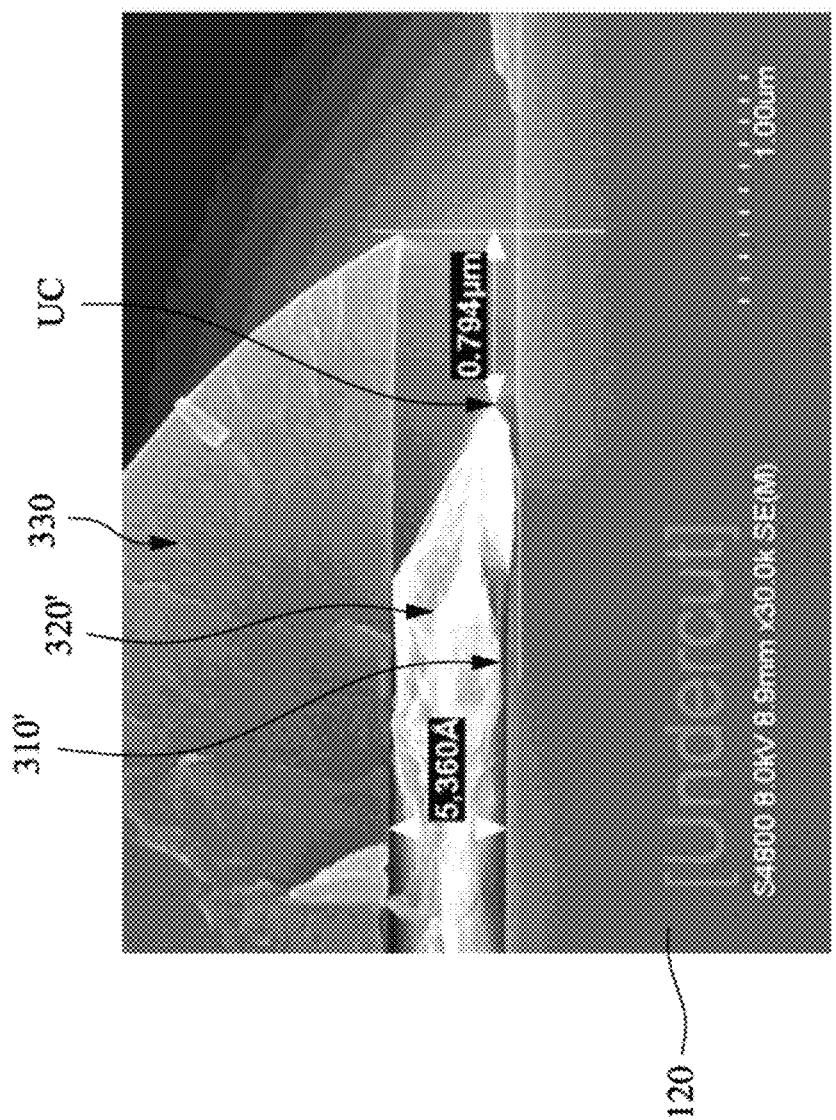
FIG. 3A to FIG. 3D are scanning electron microscope (SEM) diagrams of a metal structure according to some implementations of the present disclosure.
Figure 3B:
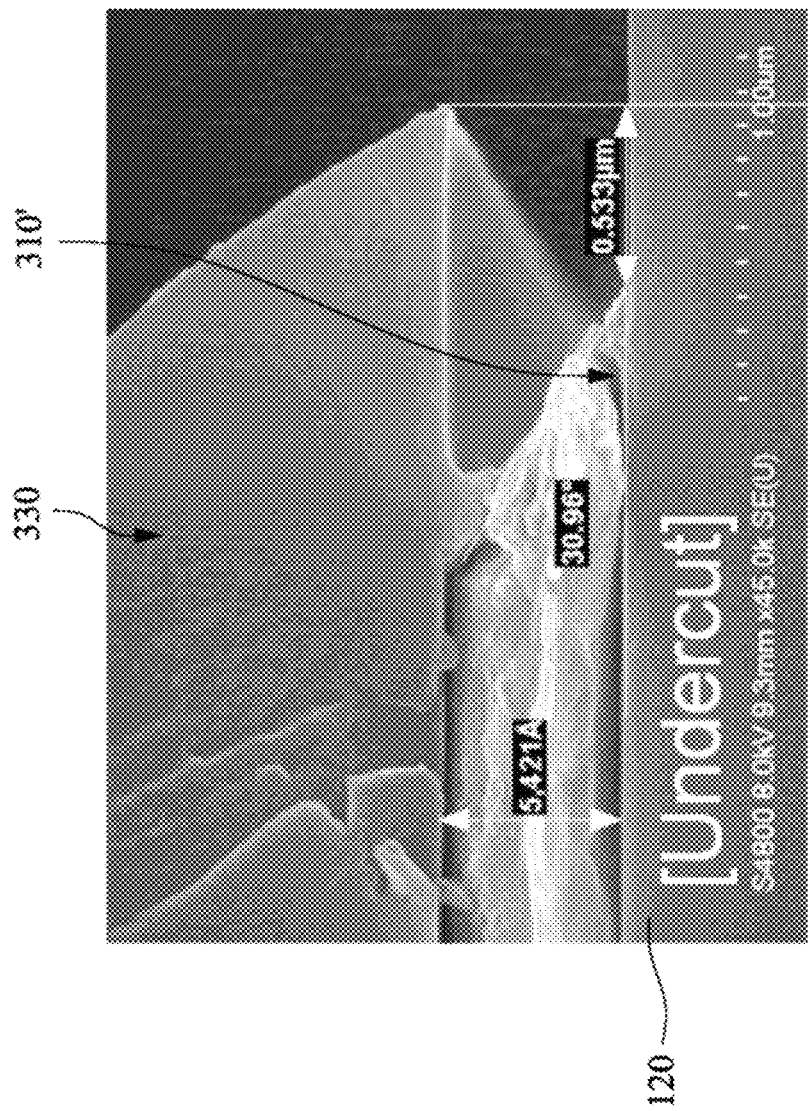
Figure 3C:
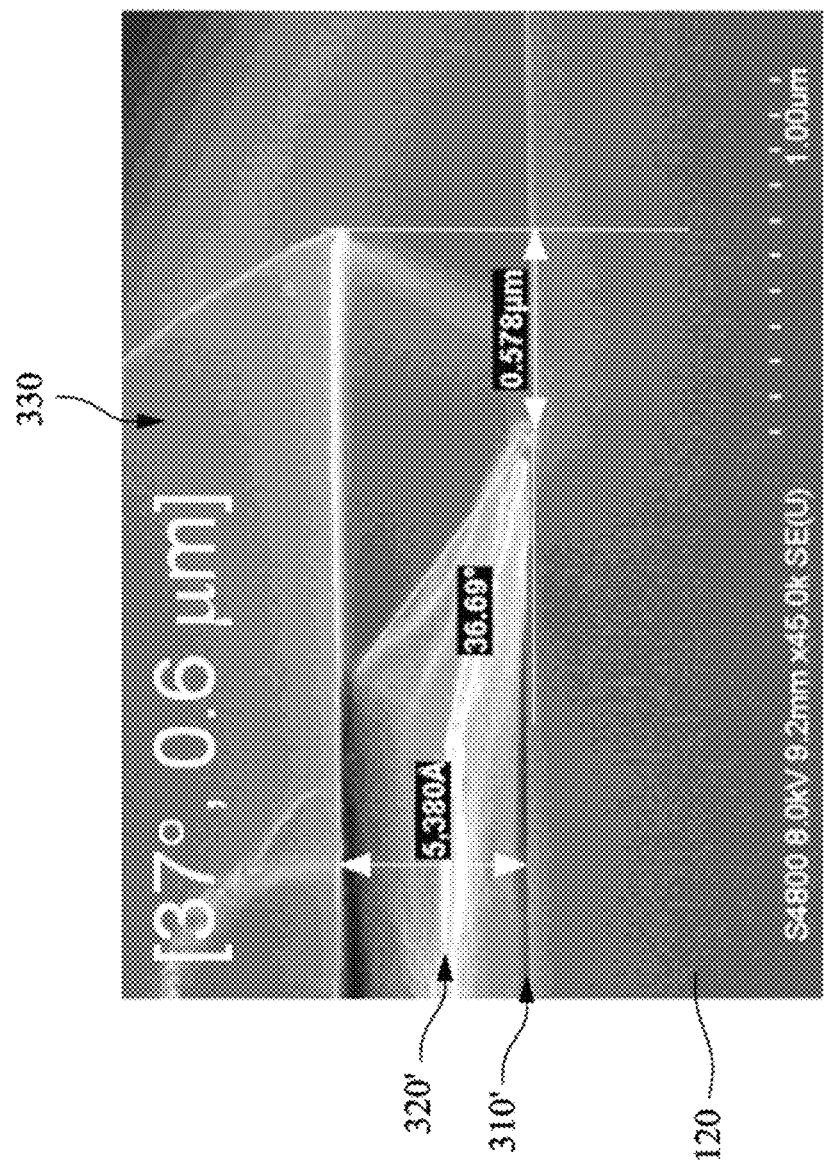
Figure 3D:
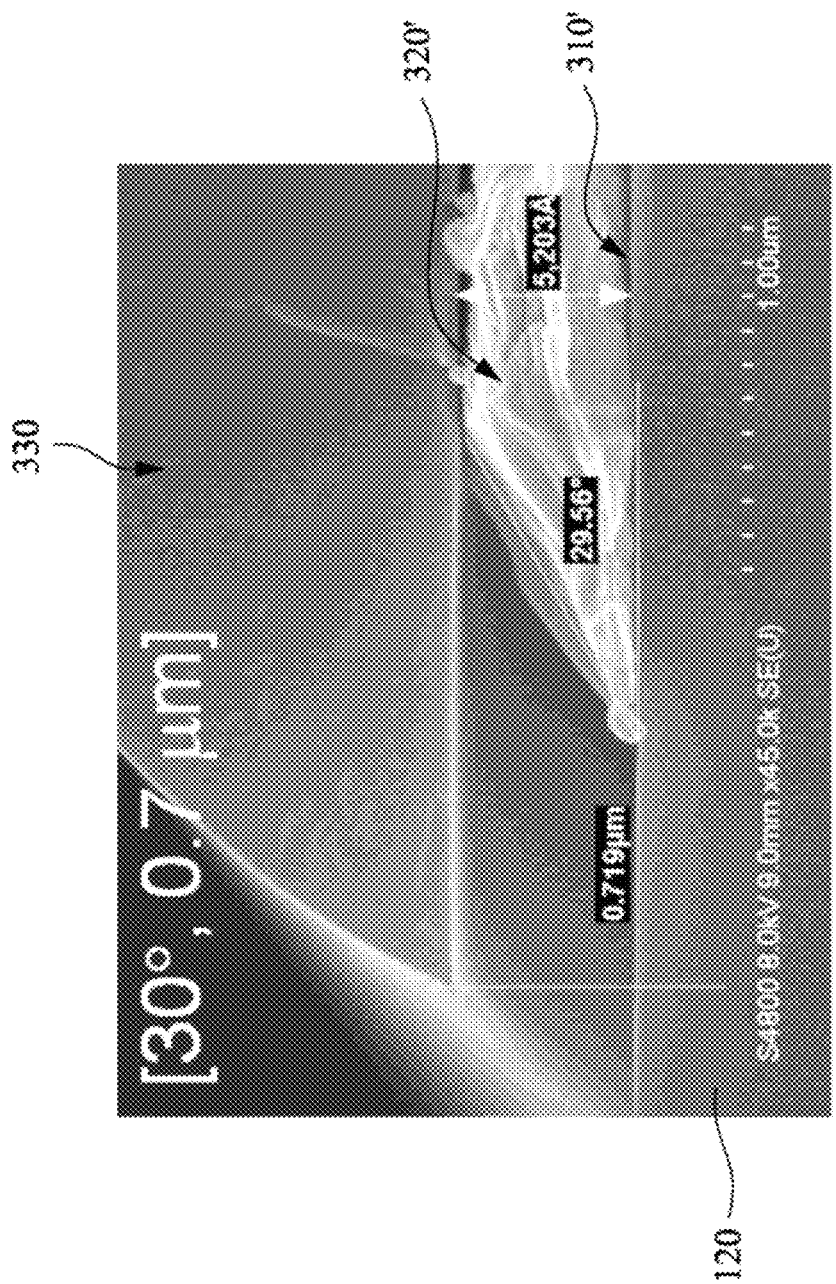
Figure 4A:
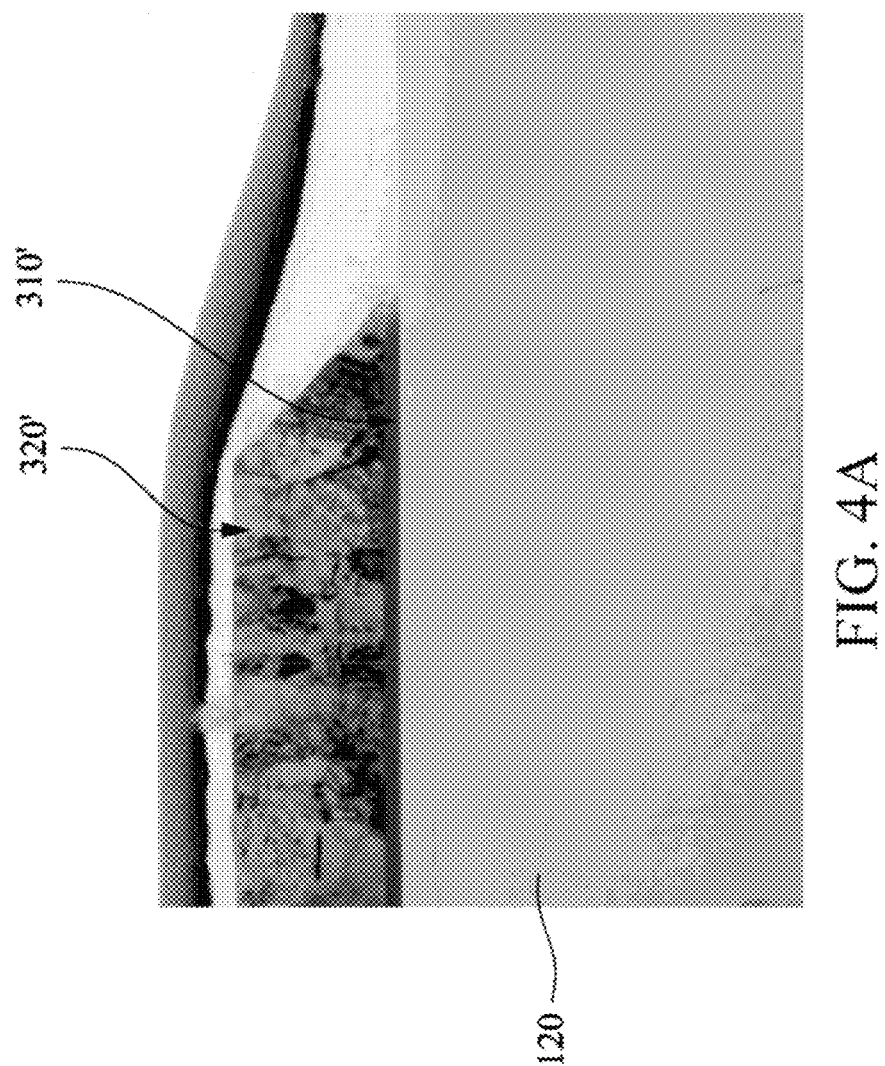
FIG. 4A to FIG. 4D are transmission electron microscope (TEM) diagrams of a metal structure according to some implementations of the present disclosure.
Figure 4B:
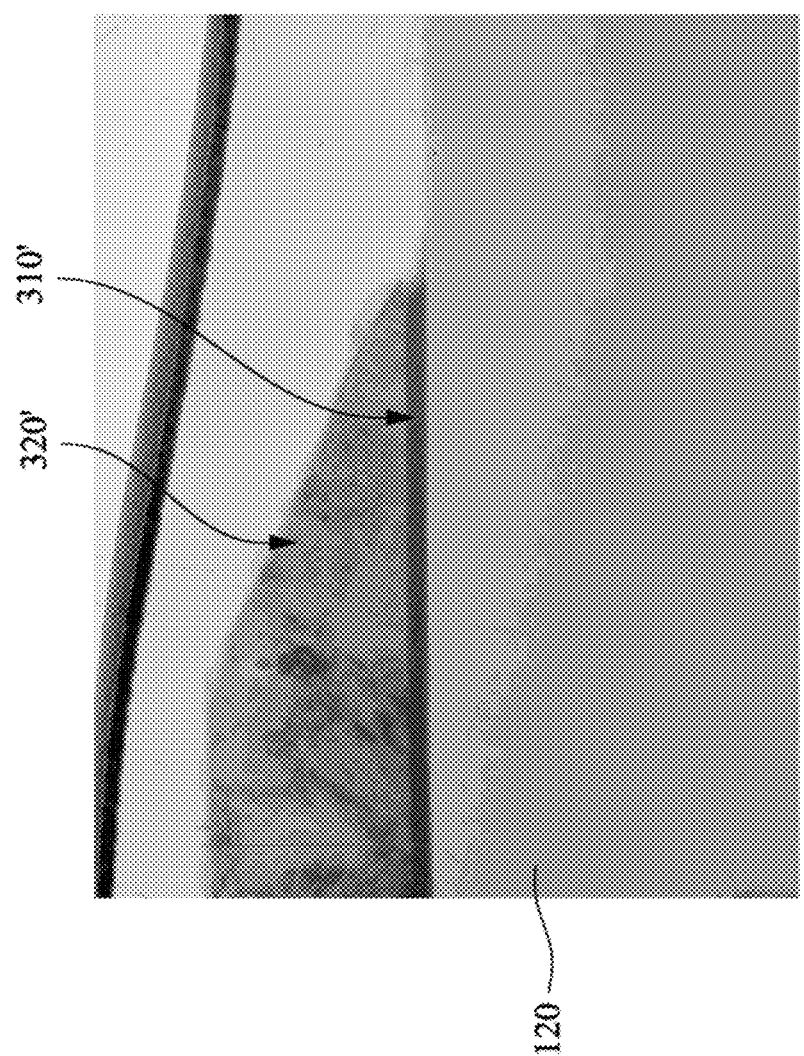
Figure 4C:
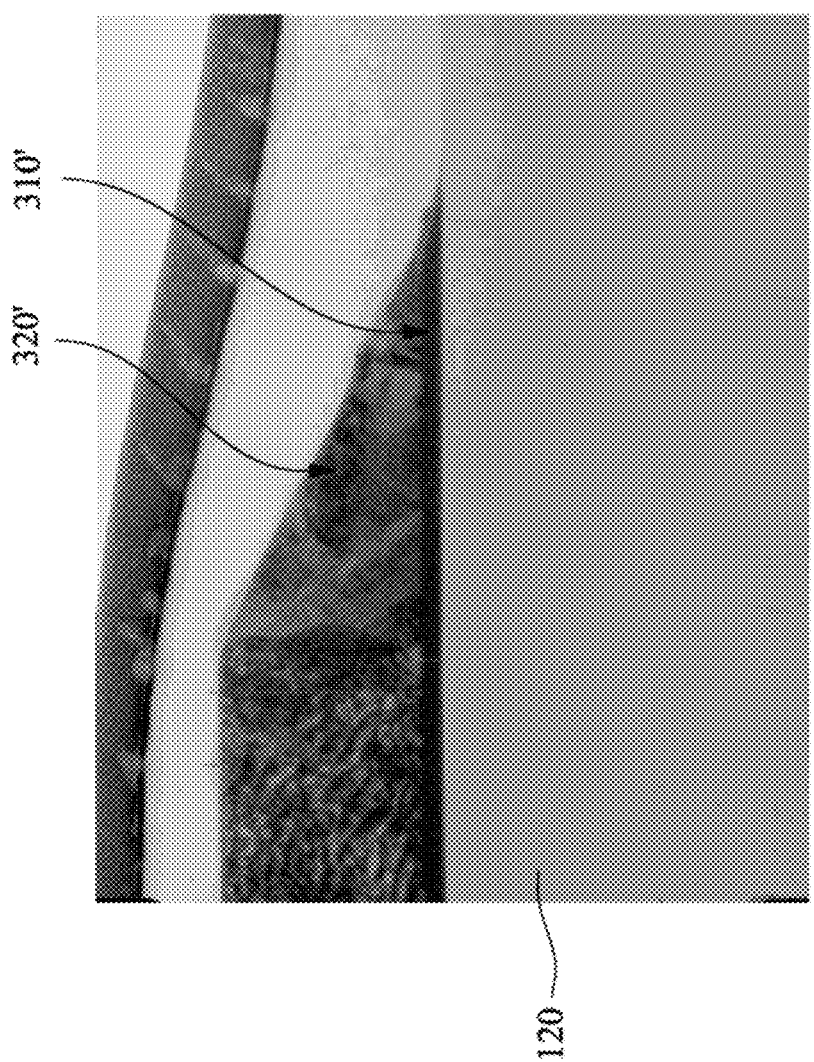
Figure 4D:
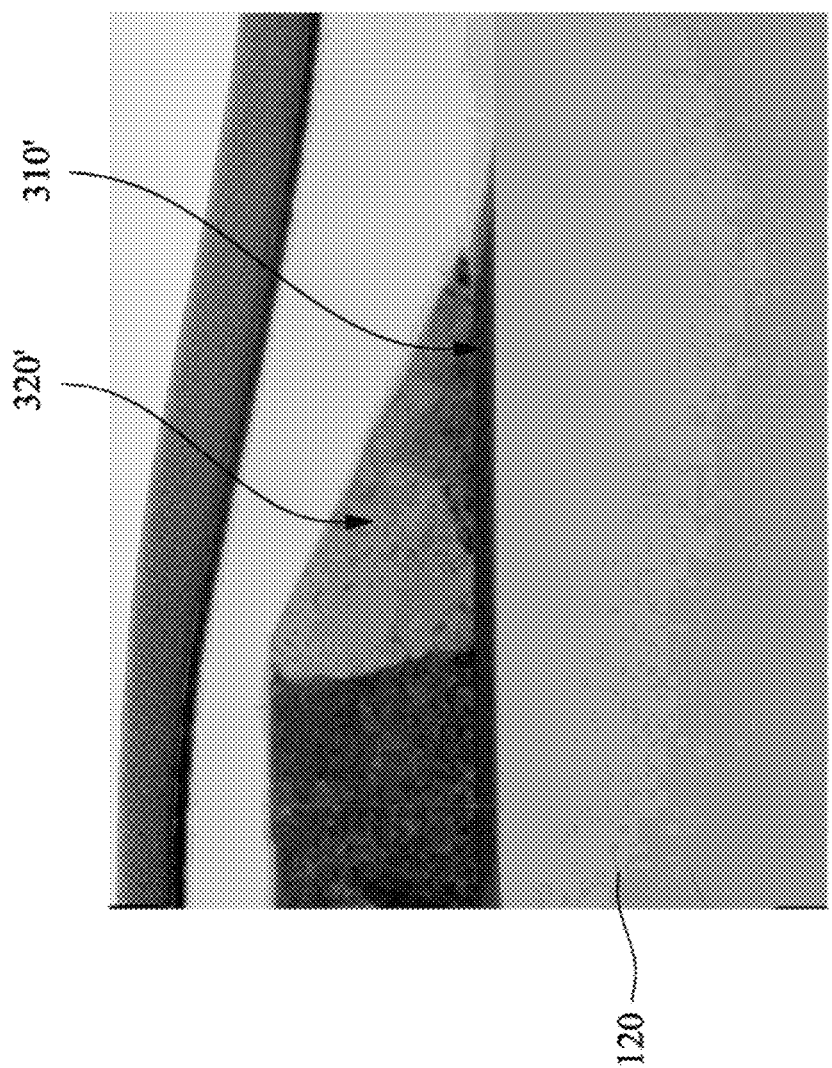

FIG. 3A to FIG. 3D are SEM diagrams of the metal structure 300 (referring to FIG. 2D) that is of various atomic percents and that still has a photoresist after being etched according to some implementations of the present disclosure. Atomic percents of tantalum (Ta) of the patterned molybdenum tantalum oxide layers 310' of the metal structures 300 (referring to FIG. 2D) in FIG. 3A to FIG. 3D are about 0%, about 2%, about 4%, and about 6% respectively. It may be learned from the figure, when the atomic percent of tantalum is about 0%, the metal structure 300 is obviously undercut. As shown in FIG. 3A, at a mark UC, an edge of the metal structure 300 has a groove, but the metal structure 300 is not connected to the first substrate 120. This is the undercut phenomenon. As the atomic percent of tantalum increases, an undercut degree gradually decreases. As shown in FIG. 3B to FIG. 3D, a groove at an edge of the metal structure 300 gradually scales down as the atomic percent of tantalum increases.

Although the metal structures 300 (referring to FIG. 2D) in FIG. 3A to FIG. 3D merely experience the acid etching solution, and does not experience the alkaline photoresist removal solution, a relationship between the undercut degree and tantalum can already be learned.

FIG. 4A to FIG. 4D are TEM diagrams of the metal structure 300 (referring to FIG. 2E) of various atomic percents after photoresist removal is performed according to some implementations of the present disclosure. Atomic percents of tantalum (Ta) of the patterned molybdenum tantalum oxide layers of the metal structures 300 (referring to FIG. 2E) in FIG. 4A to FIG. 4D are about 6%, about 8%, about 10%, and about 12% respectively. It can be learned from the figure that, as the atomic percent of tantalum increases, the undercut degree gradually decreases. However, as the atomic percent of tantalum increases, the required undercut time also gradually increases. In this embodiment, a material of the patterned metal layer 320' uses copper as an example. An effect of a patterned metal structure 300 may be achieved after the metal structures 300 (referring to FIG. 2E) in FIG. 3A to FIG. 3D are etched for about 108 s, about 120 s, about 135 s, and about 148 s. However, the etching time may vary with testing conditions, and this is merely intended to describe that different material composition leads to a relative relationship of the etching time.

Based on this, in some implementations of the present disclosure, the atomic percent of tantalum in the molybdenum tantalum oxide is designed to be between about 2% and 12% to reduce the undercut degree and improve the processing effect. In such a design, an atomic percent of molybdenum and an atomic percent of oxygen are greater than the atomic percent of tantalum. In some implementations of the present disclosure, the molybdenum tantalum oxide includes about 5 to 60 atomic percent of oxygen. The atomic percent of tantalum, the atomic percent of molybdenum, and the atomic percent of oxygen in the molybdenum tantalum oxide can be obtained by using an energy dispersive spectroscopy (EDS) to analyze substance content in the patterned molybdenum tantalum oxide layer 310' (referring to FIG. 2D and FIG. 2E).

Figure 5:
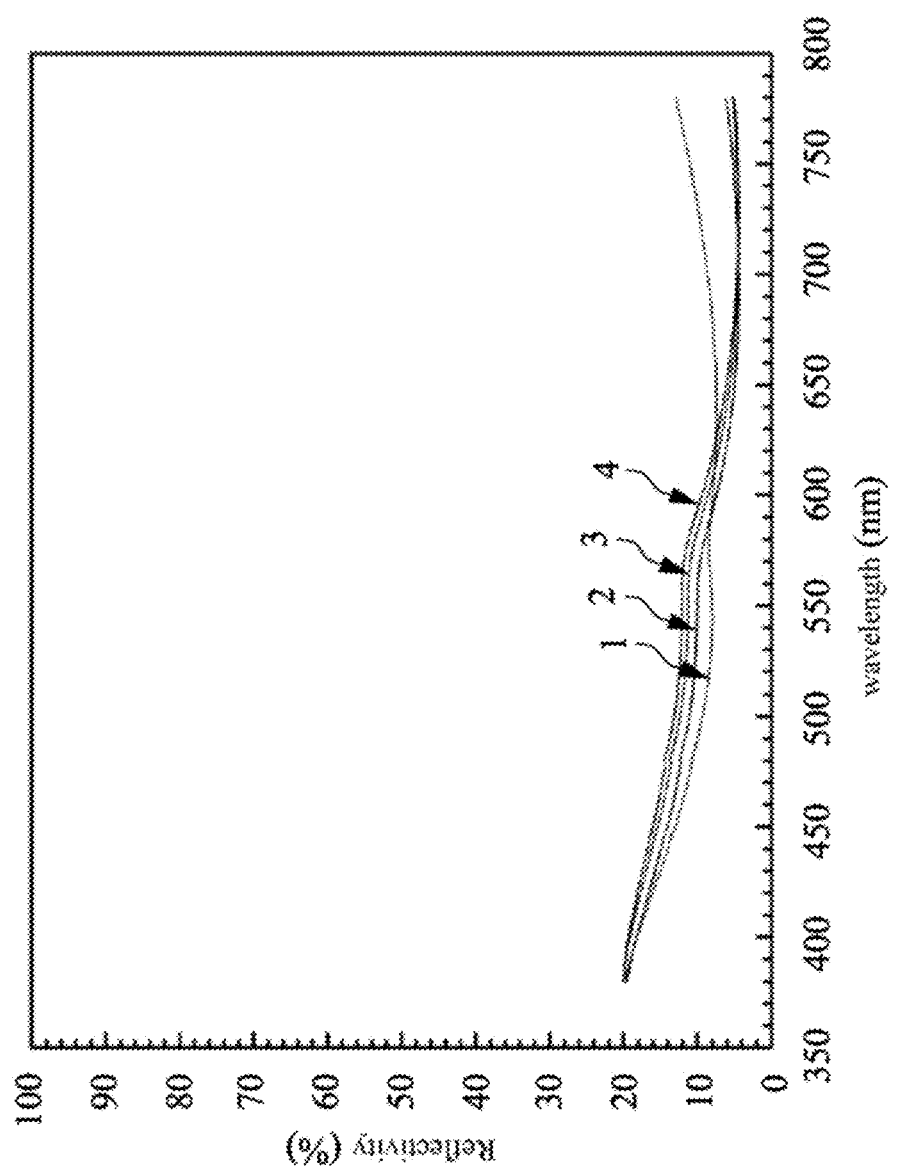
FIG. 5 is a reflection spectrum diagram of a metal structure according to some implementations of the present disclosure.

FIG. 5 is a reflection spectrum diagram of a metal structure 300 according to some implementations of the present disclosure. Numbers 1 to 4 respectively represent the reflectivity of the metal structure 300 (referring to FIG. 2E) when an atomic percent of tantalum (Ta) of the patterned molybdenum tantalum oxide layer 310' (referring to FIG. 2E) is about 6%, about 8%, about 10%, and about 12% respectively. As shown in the figure, the reflectivity of the metal structure 300 (that is, the patterned metal layer 320' and the patterned molybdenum tantalum oxide layer 310') within a visible light range is between about 2% and 20%. This can reduce the reflection of ambient light, so that the visual effect of the viewer is not affected.

In some implementations of the present disclosure, the circuit configuration can be prevented from occupying display frames if an active device array substrate is disposed near a user (that is, the active device array substrate provides a display surface), so as to achieve a narrow bezel effect. Further, in the active device array substrate, the reflection of ambient light can be reduced by designing that the low-reflection layer is located between the metal layer and the substrate, so as to achieve a better visual effect. Based on this, the display panel in the embodiments of the present disclosure can have a narrow bezel or can be four side bezel-less and effectively reduce the light reflection without reducing the display luminance. The present disclosure is disclosed through the foregoing multiple implementations; however, these implementations are not intended to limit the present disclosure. Various changes and modifications made by a person skilled in the art without departing from the spirit and scope of the present disclosure shall fall within the protection scope of the present disclosure. The protection scope of the present disclosure is subject to the appended claims.

What is claimed is:

1. A method for fabricating a metal structure of a display panel, comprising:
   providing a first substrate;
   forming a molybdenum tantalum oxide layer on an inner surface of the first substrate, wherein the molybdenum tantalum oxide layer comprises a molybdenum tantalum oxide comprising 2 to 12 atomic percent of tantalum, and both of an atomic percent of molybdenum and an atomic percent of oxygen are greater than the atomic percent of tantalum;
   forming a metal layer on the molybdenum tantalum oxide layer; and
   performing a patterning process on the molybdenum tantalum oxide layer and the metal layer to form a patterned molybdenum tantalum oxide layer and a patterned metal layer, wherein:
   the patterned metal layer is disposed between the patterned molybdenum tantalum oxide layer and an inner surface of a second substrate; the first substrate has an outer surface, the inner surface, and a first side edge connecting the outer surface and the inner surface of the first substrate, wherein the outer surface serves as a display surface of the display panel; and
   the second substrate has an outer surface, the inner surface, and a second side edge connecting the outer surface and the inner surface of the second substrate, wherein the inner surface of the second substrate is opposite to the inner surface of the first substrate, the first side edge and the second side edge are located on a same side of the display panel, and the first side edge is substantially aligned with or longer than the second side edge, wherein the patterned metal layer comprises at least one of a gate line, a gate, a common line, a data line, a source, or a drain.

2. The method according to claim 1, wherein the step of performing a patterning process on the molybdenum tantalum oxide layer and the metal layer comprises:
   forming a patterned photoresist layer on the metal layer; and
   using the patterned photoresist layer as a mask to etch the molybdenum tantalum oxide layer and the metal layer by using an acid etching solution.

3. The method according to claim 1, wherein performing the patterning process on the molybdenum tantalum oxide layer and the metal layer comprises:
   removing the patterned photoresist layer by using an alkaline photoresist removal solution.

4. The method according to claim 1, wherein the molybdenum tantalum oxide comprises 5 to 60 atomic percent of oxygen.

5. The method according to claim 1, wherein forming the molybdenum tantalum oxide layer on the first substrate comprises performing a non-reactive sputtering process.

6. The method according to claim 1, wherein the thickness of the patterned molybdenum tantalum oxide layer is between 50 Å and 600 Å.

7. The method according to claim 1, wherein the reflectivity of the patterned molybdenum tantalum oxide layer within a visible light range is between 2% and 20%.

* * * * *